United States Patent
Sugimoto

(10) Patent No.: US 9,972,724 B2
(45) Date of Patent: May 15, 2018

(54) ACCELERATION SENSOR AND MOUNTING STRUCTURE OF ACCELERATION SENSOR

(71) Applicant: DENSO CORPORATION, Kariya, Aichi-pref. (JP)

(72) Inventor: Kiyomasa Sugimoto, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days. days.

(21) Appl. No.: 15/536,716

(22) PCT Filed: Jan. 7, 2016

(86) PCT No.: PCT/JP2016/000059
§ 371 (c)(1),
(2) Date: Jun. 16, 2017

(87) PCT Pub. No.: WO2016/117290
PCT Pub. Date: Jul. 28, 2016

(65) Prior Publication Data
US 2017/0345948 A1    Nov. 30, 2017

(30) Foreign Application Priority Data

Jan. 21, 2015    (JP) ................................ 2015-009654

(51) Int. Cl.
*G01P 15/125*    (2006.01)
*H01L 29/84*    (2006.01)
(Continued)

(52) U.S. Cl.
CPC ............ *H01L 29/84* (2013.01); *G01P 15/125* (2013.01); *G01P 15/18* (2013.01); *B81B 2201/0235* (2013.01); *G01P 2015/0842* (2013.01)

(58) Field of Classification Search
CPC ..................... G01P 15/0802; B81B 2201/0235
See application file for complete search history.

(56) References Cited

U.S. PATENT DOCUMENTS

2003/0101817 A1    6/2003    Sakai
2003/0146358 A1    8/2003    Kaneko et al.
(Continued)

FOREIGN PATENT DOCUMENTS

JP    3303063 B2    7/2002
JP    2007-139505 A    6/2007

*Primary Examiner* — Zandra Smith
*Assistant Examiner* — Andre' C Stevenson
(74) *Attorney, Agent, or Firm* — Posz Law Group, PLC

(57) ABSTRACT

An acceleration sensor includes: a semiconductor substrate that includes a support substrate and a semiconductor layer; a first-direction movable electrode; a second-direction movable electrode; a first-direction fixed electrode; a second-direction fixed electrode; and a support member. The acceleration sensor is configured to detect acceleration in a first direction in the surface direction of the semiconductor substrate and acceleration in a second direction orthogonal to the first direction and parallel to the surface direction. The first-direction movable electrode and the first-direction fixed electrode are provided such that an angle formed by an extended direction of the first-direction movable electrode and the first-direction fixed electrode and the second direction is $\sin^{-1}(d/L)[\deg]$, and the second-direction movable electrode and the second-direction fixed electrode are provided such that an angle formed by an extended direction of the second-direction movable electrode and the second-direction fixed electrode and the first direction is $\sin^{-1}(d/L)$ [deg].

8 Claims, 10 Drawing Sheets

(51) Int. Cl.
*G01P 15/18* (2013.01)
*G01P 15/08* (2006.01)

(56) References Cited

U.S. PATENT DOCUMENTS

| | | |
|---|---|---|
| 2005/0028590 A1 | 2/2005 | Kaneko et al. |
| 2006/0053890 A1* | 3/2006 | Kano .................... G01P 15/125 |
| | | 73/514.32 |
| 2016/0187371 A1 | 6/2016 | Sakai et al. |

* cited by examiner

ACCELERATION

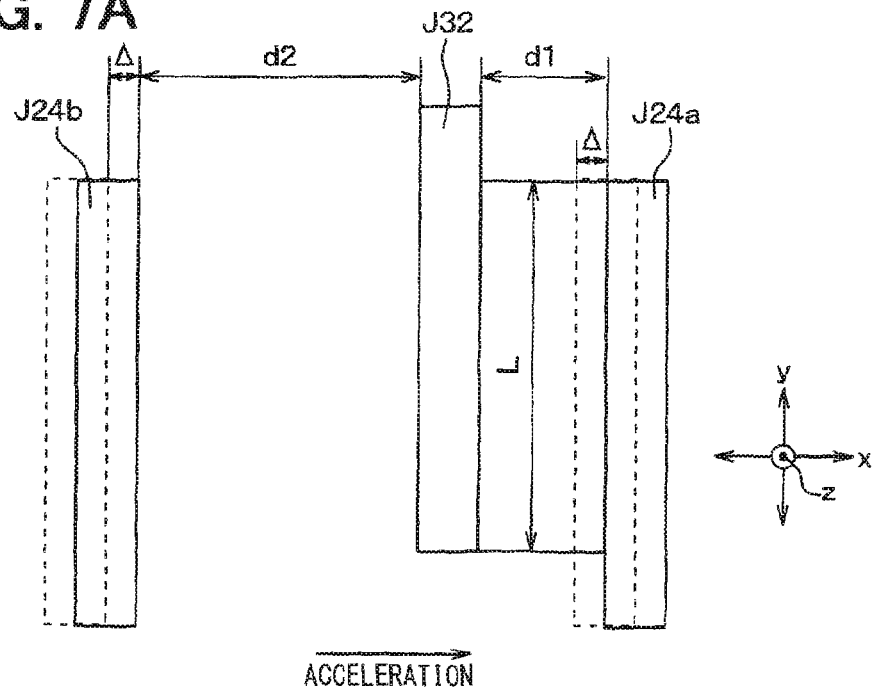
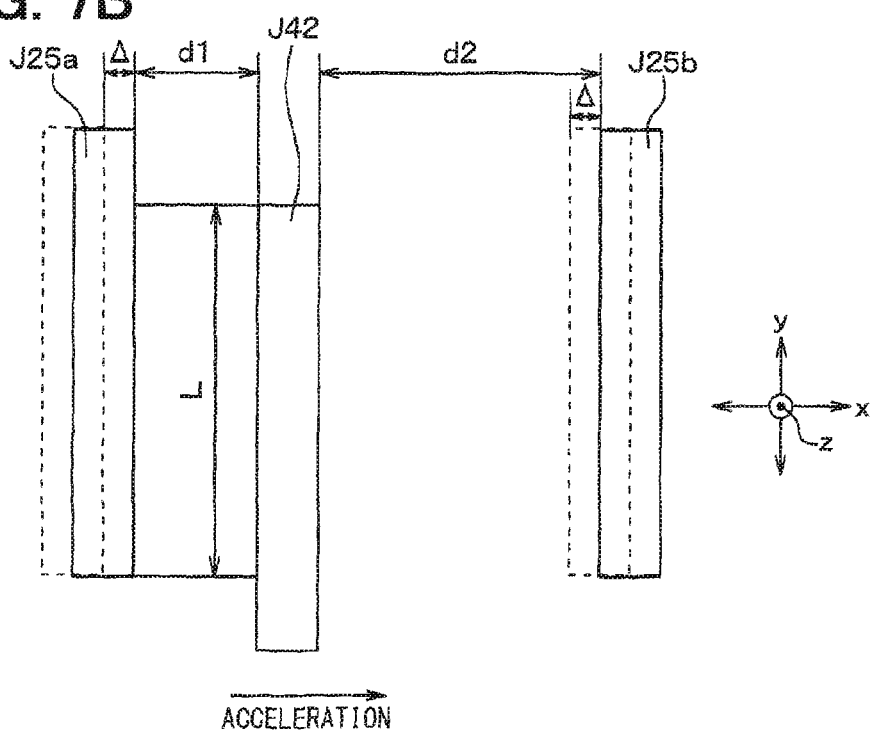

ACCELERATION SENSOR AND MOUNTING STRUCTURE OF ACCELERATION SENSOR

CROSS REFERENCE TO RELATED APPLICATIONS

This application is a U.S. national stage of International Patent Application No. PCT/JP2016/000059 filed on Jan. 7, 2016 and is based on Japanese Patent Application No. 2015-9654 filed on Jan. 21, 2015, the contents of which are incorporated herein by reference.

TECHNICAL FIELD

The present disclosure relates to an acceleration sensor detecting acceleration in two orthogonal directions, and a mounting structure of the acceleration sensor.

BACKGROUND ART

There has been proposed, for example in Patent Literature 1, that an acceleration sensor be configured using a semiconductor substrate formed by stacking a semiconductor layer on a support substrate. That is, in the acceleration sensor, a movable portion and a fixed portion are provided in a semiconductor layer, the movable portion including a movable electrode provided in a frame portion that is displaced in accordance with acceleration in a predetermined direction in a surface direction of the semiconductor layer, the fixed portion including a fixed electrode that faces the movable electrode.

In such an acceleration sensor, upon application of the acceleration in a predetermined direction, an interval between the movable electrode and the fixed electrode changes in accordance with the acceleration, and hence the acceleration is detected based on a capacitance between the movable electrode and the fixed electrode.

PRIOR ART LITERATURE

Patent Literature

Patent Literature 1: JP 2007439505 A

SUMMARY OF INVENTION

In recent years, there may be a demand for also detecting acceleration in a direction orthogonal to the predetermined direction and parallel to the surface direction of the semiconductor layer. Accordingly, the applicant of the present disclosure has proposed an acceleration sensor capable of detecting acceleration in two orthogonal directions in Japanese Patent Application No. 2013-182292 (corresponding to JP 2015-049190 A).

Specifically, in the acceleration sensor, a movable portion has a first-direction movable electrode extended along one direction in a surface direction of a semiconductor substrate, and a second-direction movable electrode extended along a direction orthogonal to the one direction. Note that the first-direction movable electrode and the second-direction movable electrode are provided on a common support member provided in the movable portion. Further, a fixed portion has a first-direction fixed electrode disposed to face the first-direction movable electrode, and a second-direction fixed electrode disposed to face the second-direction movable electrode.

In such an acceleration sensor, basically, upon application of the acceleration in a direction orthogonal to an extended direction of the first-direction movable electrode, the first-direction movable electrode is displaced, and a capacitance between the first-direction movable electrode and the first-direction fixed electrode changes. Hence, the acceleration is detected in accordance with the capacitance. Similarly, upon application of the acceleration in a direction orthogonal to an extended direction of the second-direction movable electrode, the second-direction movable electrode is displaced, and a capacitance between the second-direction movable electrode and the second-direction fixed electrode changes. Hence, the acceleration is detected in accordance with the capacitance.

In such an acceleration sensor, since the first-direction movable electrode and the second-direction movable electrode are provided on the common support member, the second-direction movable electrode is displaced when the first-direction movable electrode is displaced, and the first-direction movable electrode is displaced when the second-direction movable electrode is displaced. That is, a capacitance between the second-direction movable electrode and the second-direction fixed electrode changes upon application of the acceleration in the direction orthogonal to the extended direction of the first-direction movable electrode, and a capacitance between the first-direction movable electrode and the first-direction fixed electrode changes upon application of the acceleration in the direction orthogonal to the extended direction of the second-direction movable electrode. This might cause reduction in detection accuracy due to the influence of cross-axis sensitivity.

It is an object of the present disclosure to provide an acceleration sensor that are capable of reducing the influence of cross-axis sensitivity to inhibit the reduction in detection accuracy, and a mounting structure of the acceleration sensor.

An acceleration sensor according to one aspect of the present disclosure includes: a semiconductor substrate that includes a support substrate and a semiconductor layer stacked on the support substrate; a first-direction movable electrode that is provided in the semiconductor layer and extended in one direction of a surface direction on the semiconductor substrate; a second-direction movable electrode that is provided in the semiconductor layer and extended in another direction orthogonal to the one direction and parallel to the surface direction; a first-direction fixed electrode that is provided in the semiconductor layer and placed to face the first-direction movable electrode; a second-direction fixed electrode that is provided in the semiconductor layer and placed to face the second-direction movable electrode; and a support member that is provided in the semiconductor layer, is provided with the first-direction movable electrode and the second-direction movable electrode, and integrally displaces the first-direction movable electrode and the second-direction movable electrode in accordance with acceleration. The acceleration sensor is configured to detect acceleration in a first direction in the surface direction of the semiconductor substrate and acceleration in a second direction orthogonal to the first direction and parallel to the surface direction. When each length of a section where the first-direction movable electrode faces the first-direction fixed electrode and where the second-direction movable electrode faces the second-direction fixed electrode is L, and each interval between the first-direction movable electrode and the first-direction fixed electrode and between the second-direction movable electrode and the second-direction fixed electrode is d, the first-direction movable electrode and the first-direction fixed electrode are provided such that an angle formed by an extended direction of the first-direction movable electrode and the first-direction fixed electrode and the second direction is $\sin^{-1}(d/L)$ [deg], and at a time when the acceleration in the second direction is applied and the first-direction movable electrode is displaced, an increase/decrease in the length of the section where the first-direction movable electrode faces the first-direction fixed electrode matches an increase/decrease in the interval between the first-direction movable electrode and the first-direction fixed electrode, and the second-direction movable electrode and the second-direction fixed electrode are provided such that an angle formed by an extended direction of the second-direction movable electrode and the second-direction fixed electrode and the first direction is $\sin^{-1}(d/L)$[deg], and at a time when the acceleration in the first direction is applied and the second-direction movable electrode is displaced, an increase/decrease in the length of the section where the second-direction movable electrode faces the second-direction fixed electrode matches an increase/decrease in the interval between the second-direction movable electrode and the second-direction fixed electrode.

An acceleration sensor according to another aspect of the present disclosure includes: a semiconductor substrate that includes a support substrate and a semiconductor layer stacked on the support substrate; a plurality of first-direction movable electrodes that are provided in the semiconductor layer and extended in one direction of a surface direction on the semiconductor substrate; a plurality of second-direction movable electrodes that are provided in the semiconductor layer and extended in another direction orthogonal to the one direction and parallel to the surface direction; at least one first-direction fixed electrode that is provided in the semiconductor layer and placed to face the first-direction movable electrodes, and sandwiched between the plurality of first-direction movable electrodes; at least one second-direction fixed electrode that is provided in the semiconductor layer and placed to face the second-direction movable electrodes, and sandwiched between the plurality of second-direction movable electrodes; and a support member that is provided in the semiconductor layer, is provided with the first-direction movable electrodes and the second-direction movable electrodes, and integrally displaces the first-direction movable electrodes and the second-direction movable electrodes in accordance with acceleration. The acceleration sensor is configured to detect acceleration in a first direction in the surface direction of the semiconductor substrate and acceleration in a second direction orthogonal to the first direction and parallel to the surface direction. When each length of a section where the first-direction movable electrodes face the first-direction fixed electrode and where the second-direction movable electrodes face the second-direction fixed electrode is L, each interval between the first-direction fixed electrode and one of pair of the first-direction movable electrodes that sandwich the first-direction fixed electrode and between the second-direction fixed electrode and one of pair of the second-direction movable electrodes that sandwich the second-direction fixed electrode is d1, and each interval between the first-direction fixed electrode and another of the pair of the first-direction movable electrodes that sandwich the first-direction fixed electrode and between the second-direction fixed electrode and another of the pair of the second-direction movable electrodes that sandwich the second-direction fixed electrode is a·d1, the first-direction movable electrodes and the first-direction fixed electrode are provided such that an angle formed by an extended direction of the first-direction movable electrodes and the first-direction fixed electrode and the second direction is $\sin^{-1}\{a \cdot d1/L(a-1)\}$[deg], and at a time when the acceleration in the second direction is applied and the first-direction movable electrodes are displaced, an increase/decrease in the length of the section where the first-direction movable electrodes face the first-direction fixed electrode matches an increase/decrease in the interval between the first-direction movable electrodes and the first-direction fixed electrode, and the second-direction movable electrodes and the second-direction fixed electrode are provided such that an angle formed by an extended direction of the second-direction movable electrodes and the second-direction fixed electrode and the first direction is $\sin^{-1}(a \cdot d1/L(a-1))$[deg], and at a time when the acceleration in the first direction is applied and the second-direction movable electrodes are displaced, an increase/decrease in the length of the section where the second-direction movable electrodes face the second-direction fixed electrode matches an increase/decrease in the interval between the second-direction movable electrodes and the second-direction fixed electrode.

According to these acceleration sensors, since the first-direction movable electrode and the second-direction movable electrode and the first-direction and fixed electrode and the second-direction fixed electrode are formed so as to cancel cross-axis sensitivity, it is possible to inhibit the reduction in detection accuracy.

A mounting structure of an acceleration sensor according to another aspect of the present disclosure includes the acceleration sensor that includes: a semiconductor substrate that includes a support substrate and a semiconductor layer stacked on the support substrate; a first-direction movable electrode that is provided in the semiconductor layer and extended in one direction of a surface direction on the semiconductor substrate; a second-direction movable electrode that is provided in the semiconductor layer and extended in another direction orthogonal to the one direction and parallel to the surface direction on the semiconductor substrate; a first-direction fixed electrode that is provided in the semiconductor layer and placed to face the first-direction movable electrode; a second-direction fixed electrode that is provided in the semiconductor layer and placed to face the second-direction movable electrode; and a support member that is provided in the semiconductor layer, is provided with the first-direction movable electrode and the second-direction movable electrode, and integrally displaces the first-direction movable electrode and the second-direction movable electrode in accordance with acceleration. the acceleration sensor being mounted on one surface of a mount member so as to detect acceleration in a first direction in a surface direction of the one surface of the mount member and acceleration in a second direction orthogonal to the first direction and parallel to the surface direction of the one surface of the mount member. When each length of a section where the first-direction movable electrode faces the first-direction fixed electrode and where the second-direction movable electrode faces the second-direction fixed electrode is L, and each interval between the first-direction movable electrode and the first-direction fixed electrode and between the second-direction movable electrode and the second-direction fixed electrode is d, the acceleration sensor is mounted on the one surface of the mount member such that an angle formed by an extended direction of the first-direction movable electrode and the first-direction fixed electrode and the second direction of the mount member is $\sin^{-1}(d/L)$[deg], and at a time when the acceleration in the second direction is applied and the first-direction movable electrode is displaced, an increase/decrease in the length of the section where the first-direction movable electrode faces the first-direction fixed electrode matches an increase/decrease in the interval between the first-direction movable electrode and the first-direction fixed electrode, and an angle formed by an extended direction of the second-direction movable electrode and the second-direction fixed electrode and the first direction of the mount member is $\sin^{-1}(d/L)$ [deg], and at a time when the acceleration in the first direction is applied and the second-direction movable electrode is displaced, an increase/decrease in the length of the section where the second-direction movable electrode faces the second-direction fixed electrode matches an increase/decrease in the interval between the second-direction movable electrode and the second-direction fixed electrode.

A mounting structure of an acceleration sensor according to another aspect of the present disclosure includes the acceleration sensor that includes: a semiconductor substrate that includes a support substrate and a semiconductor layer stacked on the support substrate; a plurality of first-direction movable electrodes that are provided in the semiconductor layer and extended in one direction of a surface direction on the semiconductor substrate; a plurality of second-direction movable electrodes that are provided in the semiconductor layer and extended in another direction orthogonal to the one direction and parallel to the surface direction; at least one first-direction fixed electrode that is provided in the semiconductor layer and placed to face the first-direction movable electrodes, and sandwiched between the plurality of first-direction movable electrodes; at least one second-direction fixed electrode that is provided in the semiconductor layer and placed to face the second-direction movable electrodes, and sandwiched between the plurality of second-direction movable electrodes; and a support member that is provided in the semiconductor layer, is provided with the first-direction movable electrodes and the second-direction movable electrodes, and integrally displaces the first-direction movable electrodes and the second-direction movable electrodes in accordance with acceleration. The acceleration sensor being mounted on one surface of a mount member so as to detect acceleration in a first direction in a surface direction of the one surface of the mount member and acceleration in a second direction orthogonal to the first direction and parallel to the surface direction of the one surface of the mount member. When each length of a section where the first-direction movable electrodes face the first-direction fixed electrode and where the second-direction movable electrodes face the second-direction fixed electrode is L, each interval between the first-direction fixed electrode and one of pair of first-direction movable electrodes that sandwich the first-direction fixed electrode and between the second-direction fixed electrode and one of pair of the second-direction movable electrodes that sandwich the second-direction fixed electrode is d1, and each interval between the first-direction fixed electrode and another of the pair of first-direction movable electrodes that sandwich the first-direction fixed electrode and between the second-direction fixed electrode and another of the pair of second-direction movable electrodes that sandwich the second-direction fixed electrode is a·d1, the acceleration sensor is mounted on the one surface of the mount member such that an angle formed by an extended direction of the first-direction movable electrodes and the first-direction fixed electrode and the second direction is $\sin^{-1}\{a \cdot d1/L(a-1)\}$ [deg], and at a time when the acceleration in the second direction is applied and the first-direction movable electrodes are displaced, an increase/decrease in the length of the section where the first-direction movable electrodes face the first-direction fixed electrode matches an increase/decrease in the interval between the first-direction movable electrodes and the first-direction fixed electrode, and an angle formed by an extended direction of the second-direction movable electrodes and the second-direction fixed electrode and the first direction is $\sin^{-1}(a \cdot d1/L(a-1))$[deg], and at a time when the acceleration in the first direction is applied and the second-direction movable electrodes are displaced, an increase/decrease in the length of the section where the second-direction movable electrodes face the second-direction fixed electrode matches an increase/decrease in the interval between the second-direction movable electrode and the second-direction fixed electrode.

According to the mounting structure of the acceleration sensor, since the first-direction movable electrode and the second-direction movable electrode and the first-direction fixed electrode and the second-direction fixed electrode are disposed such that the cross-axis sensitivity can be cancelled, it is possible to inhibit the reduction in detection accuracy.

The acceleration sensor and the mounting structure of the acceleration sensor according to the present disclosure can reduce the influence of the cross-axis sensitivity to inhibit the reduction in detection accuracy.

BRIEF DESCRIPTION OF DRAWINGS

The above and other objects, features and advantages of the present disclosure will become more apparent from the following detailed description made with reference to the accompanying drawings. In the drawings:

FIG. 7A is a diagram showing states of first movable electrodes and the first fixed electrode upon application of acceleration in the conventional acceleration sensor;

FIG. 7B is a diagram showing states of second movable electrodes and the second fixed electrode upon application of the acceleration in the conventional acceleration sensor;

DESCRIPTION OF EMBODIMENTS

Embodiments of the present disclosure will be described based on the drawings. Note that portions same as or similar to each other in the following embodiments are provided with the same numeral for description.

(First Embodiment)

Figure 1:
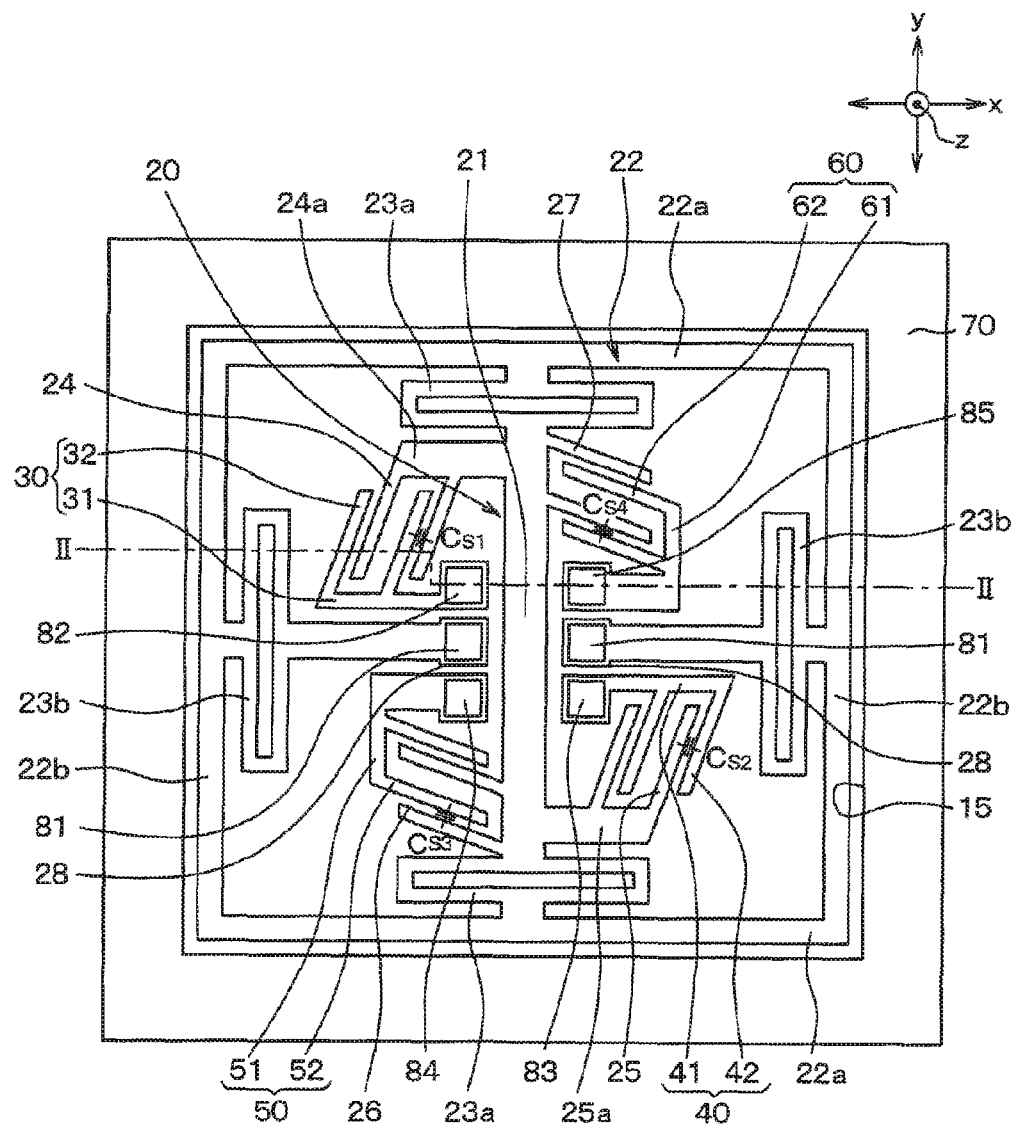
FIG. 1 is a plan view of an acceleration sensor according to a first embodiment of the present disclosure.
Figure 2:
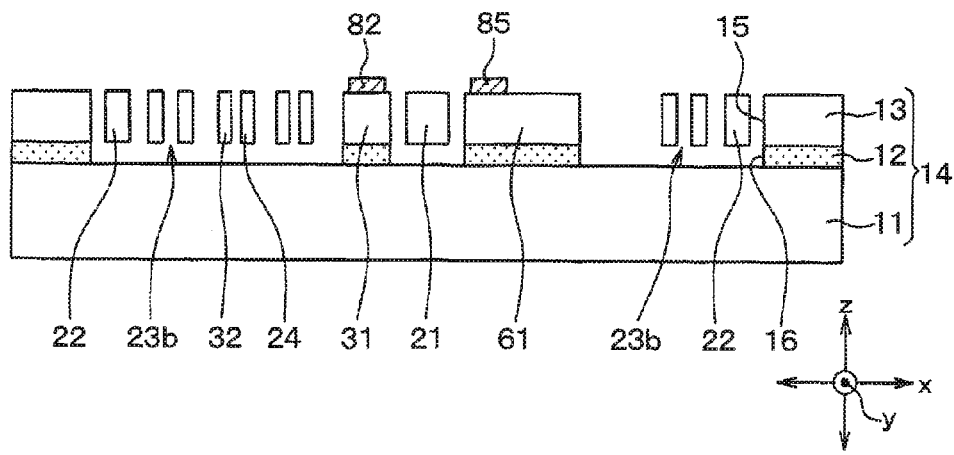
FIG. 2 is a sectional view along a line II-II of FIG. 1.

A first embodiment of the present disclosure will be described based on the drawings. As shown in FIGS. 1 and 2, an acceleration sensor of the present embodiment is configured using an SOI (Silicon On Insulator) substrate 14 formed by stacking a semiconductor layer 13 on a support substrate 11 via an insulation film 12.

In the present embodiment, the SOI substrate 14 corresponds to the semiconductor substrate of the present disclosure. Further, for example, a silicon substrate or the like is used for the support substrate 11, $SiO_2$, SiN or the like is used for the insulation film 12, and a silicon substrate, polysilicon, or the like is used for the semiconductor layer 13.

The semiconductor layer 13 is processed by micromachining to form a groove 15, and divided by the groove 15 into a movable portion 20 and first to fourth fixed portions 30 to 60. Note that a section of the semiconductor layer 13 that is not divided by the groove 15 is referred to as a peripheral portion 70. That is, the section of the semiconductor layer 13 that surrounds the movable portion 20 and the first to fourth fixed portions 30 to 60 via the groove 15 is referred to as the peripheral portion 70.

The insulation film 12 is formed with a depression 16 where a section corresponding to a predetermined region of each of the movable portion 20 and the first to fourth fixed portions 30 to 60 is removed. Hence, the predetermined region of each of the movable portion 20 and the first to fourth fixed portions 30 to 60 of the semiconductor layer 13 is in the state of having been released from the support substrate 11. In order to inhibit the predetermined region of each of the movable portion 20 and the first to fourth fixed portions 30 to 60 from coming into contact with the support substrate 11, a depression may be formed in a section of the support substrate 11 which corresponds to the predetermined region of each of the movable portion 20 and the first to fourth fixed portions 30 to 60.

Each of an x-axis direction, a y-axis direction, and a z-axis direction in FIGS. 1 and 2 will be described here. In FIGS. 1 and 2, the x-axis direction is set as a crosswise direction in the paper of FIG. 1, the y-axis direction is set as a direction orthogonal to the x-axis direction in the surface direction of the SOI substrate 14, and the z-axis direction is set as a direction orthogonal to the x-axis direction and the y-axis direction. In the present embodiment, the x-axis direction corresponds to a first direction of the present disclosure, and the y-axis direction corresponds to a second direction of the present disclosure.

The movable portion 20 has a weight portion 21 disposed so as to pass across the depression 16, a frame portion 22 that supports the weight portion 21, first and second beam portions 23a, 23b provided in the frame portion 22, and first to fourth movable electrodes 24 to 27.

The weight portion 21 is formed in a rectangular bar shape, and both ends thereof in a longitudinal direction are supported in the frame portion 22 via the first beam portion 23a. Specifically, the weight portion 21 is supported in the frame portion 22 such that the longitudinal direction of the weight portion 21 is parallel to the y-axis direction, and the weight portion 21 passes through the center of the frame portion 22.

In the present embodiment, the frame portion 22 is formed in a rectangular frame shape, and has a pair of first sides 22a extending in the x-axis direction and a pair of second sides 22b extending in the y-axis direction. The frame portion 22 is formed such that the center of the frame portion matches the center of the support substrate 11 (semiconductor layer 13).

Each of the first and second beam portions 23a, 23b is formed in a rectangular frame shape with two parallel beams coupled at both ends thereof, and has a spring function to be displaced in a direction orthogonal to the longitudinal direction of the two beams. The first beam portion 23a is provided between each first side 22a of the frame portion 22 and each end of the weight portion 21 such that the weight portion 21 is displaced in the y-axis direction upon application of acceleration containing a component of the y-axis direction, and such that the weight portion 21 is returned to the original state in accordance with disappearance of the acceleration. Further, the second beam portion 23b is provided in each second side 22b of the frame portion 22 such that the frame portion 22 is displaced in the x-axis direction upon application of acceleration containing a component of the x-axis direction, and such that the frame portion 22 is returned to the original state in accordance with disappearance of the acceleration. In the present embodiment, the second beam portions 23b are symmetric with respect to the weight portion 21, and each formed inside the second side 22b of the frame portion 22.

On the opposite side to the second side 22b of the frame portion 22 across the second beam portion 23b, an anchor portion 28 supported on the support substrate 11 is formed via the insulation film 12, and the frame portion 22 is supported on the support substrate 11 via the anchor portion 28. In other words, the frame portion 22 is supported on the support substrate 11 by the anchor portion 28 formed inside the frame portion 22. In the present embodiment, the anchor portions 28 coupled with the respective second beam portion 23b are symmetric with respect to the weight portion 21.

In the present embodiment, the number of each of the first and second movable electrodes 24, 25 and the third and fourth movable electrodes 26, 27 are two in the weight portion 21 so as to be symmetric with respect to the center of the frame portion 22.

Specifically, in the weight portion 21, first and second support portions 24a, 25a that protrude from both side surfaces of the weight portion 21 in the mutually opposite directions, are provided so as to be symmetric with respect to the center of the frame portion 22. The first and second movable electrodes 24, 25 are then provided in the first and second support portions 24a, 25a so as to protrude from the first and second support portions 24a, 25a to the imaginary line side extending in the direction parallel to the x-axis direction through the center of the frame portion 22. Further, the third and fourth movable electrodes 26, 27 are provided in the weight portion 21 so as to protrude in mutually opposite directions from both side surfaces of the weight portion 21. In more detail, in the present embodiment, the first and second movable electrodes 24, 25 are extended such that an angle formed by an extended direction of the first and second movable electrodes 24, 25 and the y-axis direction is a predetermined angle. Further, the third and fourth movable electrodes 26, 27 are extended such that an angle formed by an extended direction of the third and fourth movable electrodes 26, 27 and the x-axis direction is a predetermined angle. A specific description is given later of the angle formed by the extended direction of the first and second movable electrodes 24, 25 and the y-axis direction, and the angle formed by the extended direction of the third and fourth movable electrodes 26, 27 and the x-axis direction.

Note that the first to fourth movable electrodes 24 to 27 are all formed in the same shape (size), Further, in the present embodiment, the first and second movable electrodes 24, 25 correspond to the first-direction movable electrode of the present disclosure, and the third and fourth movable electrodes 26, 27 correspond to the second-direction movable electrode of the present disclosure. The weight portion 21, the frame portion 22, the first and second beam portions 23*a*, 23*b*, and the anchor portion 28 correspond to the support member of the present disclosure that supports the first to fourth movable electrodes 24 to 27.

The first to fourth fixed portions 30 to 60 respectively have first to fourth wiring portions 31 to 61 supported on the insulation film 12, and first to fourth fixed electrodes 32 to 62 respectively supported on the first to fourth wiring portions 31 to 61, engaged with comb teeth of the first to fourth movable electrodes 24 to 27, and extended in directions parallel to the extended directions of the first to fourth movable electrodes 24 to 27. The first to fourth fixed portions 30 to 60 are symmetric with respect to the center of the frame portion 22 (the support substrate 11). In the present embodiment, the number of each of the first to fourth fixed electrodes 32 to 62 are two. Each of the fixed electrodes disposed between two each of the first to fourth movable electrodes 24 to 27, namely each of the first to fourth fixed electrodes 32 to 62 sandwiched between two each of the first to fourth movable electrodes 24 to 27, is disposed close to one of the two each of the first to fourth movable electrodes 24 to 27. That is, each of the first to fourth fixed electrodes 32 to 62 sandwiched between two each of the first to fourth movable electrodes 24 to 27 is disposed such that an interval between each fixed electrode and each of the one first to fourth movable electrodes 24 to 27 is shorter than an interval between each fixed electrode and each of the other first to fourth movable electrodes 24 to 27.

Further, similarly to the first to fourth movable electrodes 24 to 27, the first to fourth fixed electrodes 32 to 62 are extended such that an angle formed by an extended direction thereof and the x-axis direction or the y-axis direction is a predetermined angle. A specific description is given later of the angle formed by the extended direction of the first and second fixed electrodes 32, 42 and the y-axis direction, and the angle formed by the extended direction of the third and fourth fixed electrodes 52, 62 and the x-axis direction.

Note that the first to fourth fixed electrodes 32 to 62 are all formed in the same shape (size), and intervals and facing areas between the first to fourth fixed electrodes 32 to 62 and the corresponding first to fourth movable electrodes 24 to 27 are all made equal. Further, in the present embodiment, the first and second fixed electrodes 32, 42 correspond to the first-direction fixed electrode of the present disclosure, and the third and fourth fixed electrodes 52, 62 correspond to the second-direction fixed electrode of the present disclosure.

Pads 81 to 85 are formed in the anchor portion 28 and the first to fourth wiring portions 31 to 61 of the semiconductor layer 13, to enable electric connection with an external circuit via wires or the like. Although not particularly shown in FIG. 1, a pad may also be formed in the peripheral portion 70 of the semiconductor layer 13 so that the peripheral portion 70 can be fixed to a predetermined potential.

The above description corresponds to a basic configuration of an acceleration sensor in the present embodiment.

Next, operation of the acceleration sensor will be described. In the above acceleration sensor, as indicated by capacitance symbols in FIG. 1, a first capacitance $C_{s1}$ is configured between the first movable electrode 24 and the first fixed electrode 32, and a second capacitance $C_{s2}$ is configured between the second movable electrode 25 and the second fixed electrode 42. Similarly, a third capacitance $C_{s3}$ is configured between the third movable electrode 26 and the third fixed electrode 52, and a fourth capacitance $C_{s4}$ is configured between the fourth movable electrode 27 and the fourth fixed electrode 62.

Then, when acceleration is applied in a state where a carrier wave having a predetermined amplitude and wavelength has been inputted into each of the first to fourth movable electrodes 24 to 27 (the pads 81), each of the first capacitance $C_{s1}$ to the fourth capacitance $C_{s4}$ (potentials of the first fixed electrode 32 to the fourth fixed electrode 62) changes in accordance with the applied acceleration. Hence, acceleration in the x-axis direction is detected based on a difference between the first and second capacitances $C_{s1}$, $C_{s2}$, and acceleration in the y-axis direction is detected based on a difference between the third and fourth capacitances $C_{s3}$, $C_{s4}$. In the present embodiment, each of the first to fourth capacitances $C_{s1}$ to $C_{s4}$ is a capacitance between each of the first to fourth fixed electrodes 32 to 62 and the corresponding first to fourth movable electrodes 24 to 27 disposed close to the corresponding first to fourth fixed electrodes 32 to 62.

Next, the angle formed by the extended direction of the first to fourth movable electrodes 24 to 27 and the x-axis direction or the y-axis direction will described. First, a description is given of a state upon application of acceleration in a conventional capacitor where first and second movable electrodes are extended in the direction parallel to the y-axis direction and third and fourth movable electrodes are extended in the direction parallel to the x-axis direction, with reference to FIGS. 3A to 3D. Note that first to fourth movable electrodes J24 to J27 shown in respective FIGS. 3A to 3D are provided in the weight portion 21 basically as in FIG. 1 above, and disposed in a relation similar to that in FIG. 1 above.

First, as shown in FIGS. 3A to 3D, in a state where no acceleration has been applied, a length of a section where each of the first to fourth movable electrodes J24 to J27 faces corresponding first to fourth fixed electrodes J32 to J62 is L, a thickness of each of the first to fourth movable electrodes J24 to J27 and each of the first to fourth fixed electrodes J32 to J62 (a thickness of the semiconductor layer 13 and a length in a deep direction in the paper of FIGS. 3A to 3D) is $t_{SOI}$, and an interval between each of the first to fourth movable electrodes J24 to J27 and each of the first to fourth fixed electrodes J32 to J62 is d. Then, initial capacitances of first to fourth capacitances $C_{s1}$ to $C_{s4}$ are respectively by Expression 1:

(Expression 1)

$$C_{S1} \sim C_{S4} = \varepsilon \cdot \frac{L \cdot t_{SOI}}{d} \quad \text{(Expression 1)}$$

Here, $\in$ is a dielectric constant between each of the first to fourth movable electrodes J24 to J27 and each of the first to fourth fixed electrodes J32 to J62, and $L \cdot t_{SOI}$ is a facing area of each of the first to fourth movable electrodes J24 to J27 and each of the first to fourth fixed electrodes J32 to J62.

As shown in FIGS. 3A to 3D, it is assumed that acceleration is applied in the direction parallel to the x-axis direction, as well as a direction from the first fixed electrode J32 to the first movable electrode J21 (from left to right in the paper of FIGS. 3A to 3D). With the first to fourth movable electrodes J24 to J27 provided in the weight portion 21 (the frame portion 22) as in FIG. 1, those electrodes are integrally displaced in the x-axis direction. In FIGS. 3A to 3D, the states of the first to fourth movable electrodes J24 to J27 upon application of the acceleration are indicated by dotted lines.

Figure 3A:
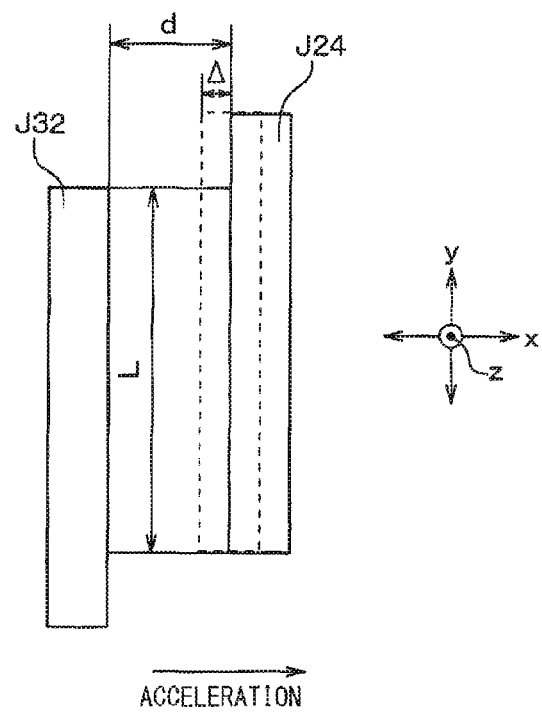
FIG. 3A is a diagram showing states of a first movable electrode and a first fixed electrode upon application of acceleration in a conventional acceleration sensor.
Figure 3B:
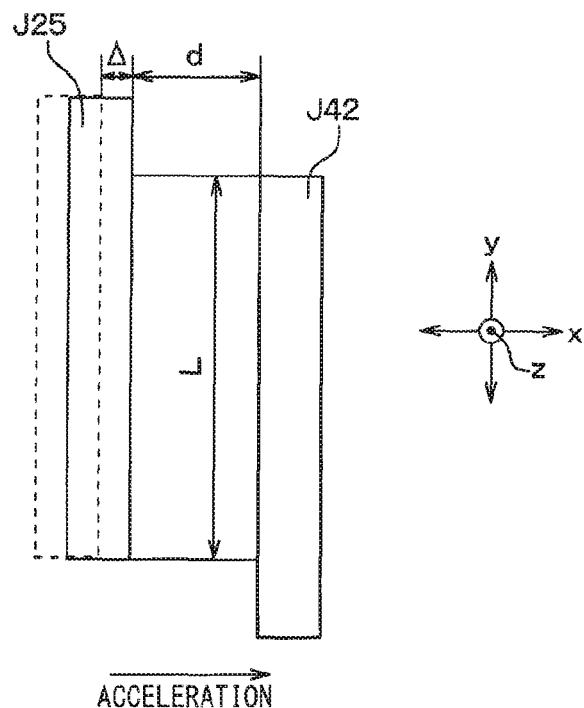
FIG. 3B is a diagram showing states of a second movable electrode and a second fixed electrode upon application of the acceleration in the conventional acceleration sensor.
Figure 3C:
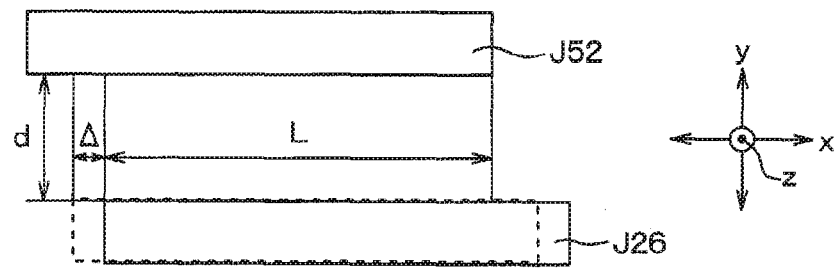
FIG. 3C is a diagram showing states of a third movable electrode and a third fixed electrode upon application of the acceleration in the conventional acceleration sensor.
Figure 3D:
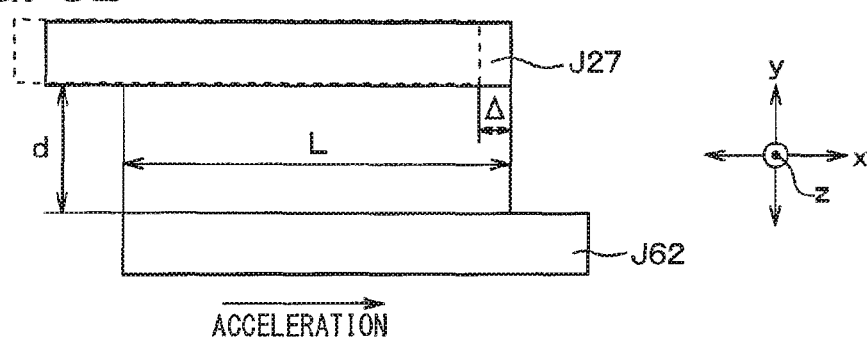
FIG. 3D is a diagram showing states of a fourth movable electrode and a fourth fixed electrode upon application of the acceleration in the conventional acceleration sensor.

Therefore, as shown in FIG. 3A, the interval between the first movable electrode J24 and the first fixed electrode J32 decreases by $\Delta$ to be d–$\Delta$, and as shown in FIG. 3B, the interval between the second movable electrode J25 and the second fixed electrode J42 increases by $\Delta$ to be d+$\Delta$. Meanwhile, as shown in FIG. 3C, the length of the section where the third movable electrode J26 faces the third fixed electrode J52 increases by $\Delta$ to be L+$\Delta$, and the length of the section where the fourth movable electrode J27 faces the fourth fixed electrode J62 decreases by $\Delta$ to be L–$\Delta$. With the description given here of the case where the acceleration along the x-axis direction has been applied, $\Delta Cx$ to be the sensitivity is represented by Expression 2 below, and $\Delta Cy$ to be the cross-axis sensitivity is represented by Expression 3 below:

(Expression 2)
$$\Delta Cx = C_{S1} - C_{S2} \\ = \varepsilon \cdot \frac{L \cdot t_{SOI}}{d - \Delta} - \varepsilon \cdot \frac{L \cdot t_{SOI}}{d + \Delta} \\ = \varepsilon \cdot \frac{L \cdot t_{SOI} \cdot 2\Delta}{d^2 - \Delta^2}$$

(Expression 3)
$$\Delta Cy = C_{S3} - C_{S4} \\ = \varepsilon \cdot \frac{(L + \Delta) \cdot t_{SOI}}{d} - \varepsilon \cdot \frac{(L - \Delta) \cdot t_{SOI}}{d} \\ = \varepsilon \cdot \frac{t_{SOI} \cdot 2\Delta}{d}$$

Here, it is designed such that the relation between the length L of the section where each of the first to fourth movable electrodes J24 to J27 faces each of the first to fourth fixed electrodes J32 to J62 and a displacement amount $\Delta$ of each of the first to fourth movable electrodes J24 to J27 upon application of the acceleration is approximately L:$\Delta$=100:1. That is, normally, the displacement amount $\Delta$ of each of the first to fourth movable electrodes J24 to J27 upon application of the acceleration is sufficiently small as compared with the length L of the section where each of the first to fourth movable electrodes J24 to J27 faces each of the first to fourth fixed electrodes J32 to J62. For this reason, "cross-axis sensitivity/sensitivity" is represented by Expression 4:

(Expression 4)
$$\frac{\Delta Cy}{\Delta Cx} = \frac{d^2}{Ld} - \frac{\Delta^2}{Ld} = \frac{d}{L}$$

Although not particularly shown, "cross-axis sensitivity/sensitivity" in the case of application of the acceleration in the y-axis direction is also represented by Expression 4. That is, when the acceleration in the x-axis direction and the acceleration in the y-axis direction are to be detected in the conventional acceleration sensor where the first and second movable electrodes J24, J25 are extended in the direction parallel to the x-axis direction and the third and fourth movable electrodes J26, J27 are extended in the direction parallel to the y-axis direction, "cross-axis sensitivity/sensitivity" is represented by (d/L).

Figure 4A:
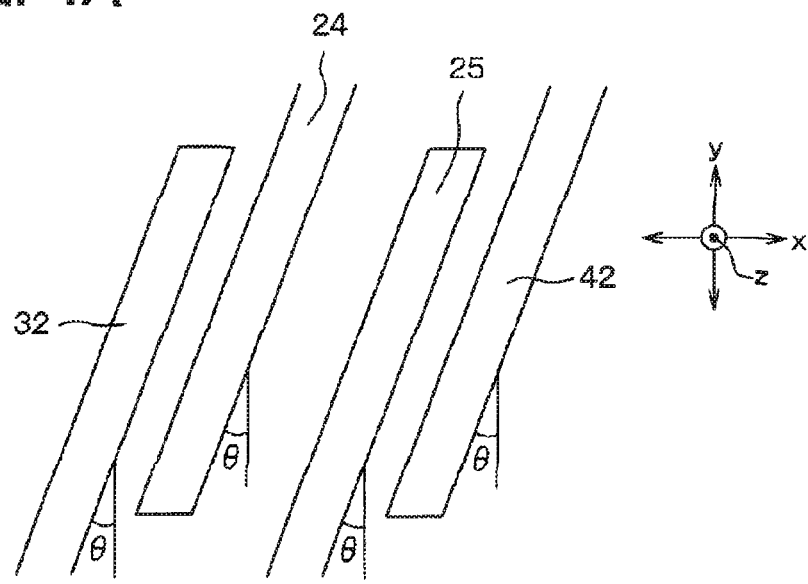
FIG. 4A is a diagram explaining an angle formed by an extended direction of first and second movable electrodes and first and second fixed electrodes and a detection axis.
Figure 4B:
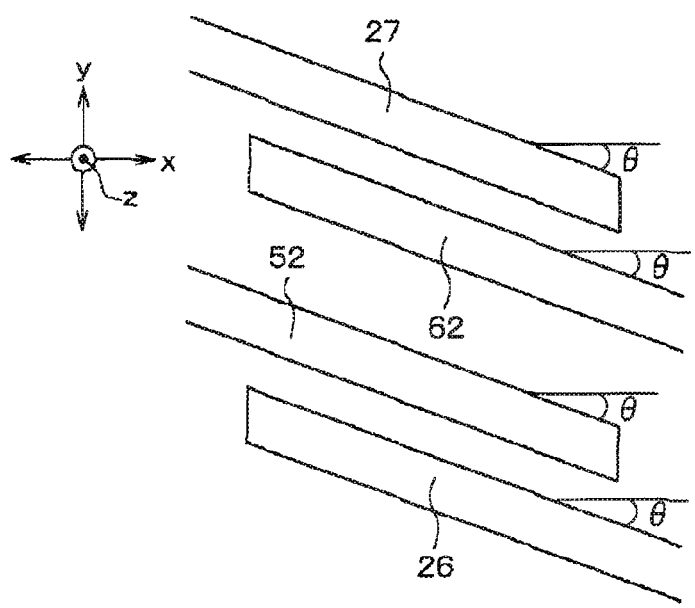
FIG. 4B is a diagram explaining an angle formed by an extended direction of third and fourth movable electrodes and third and fourth fixed electrodes and a detection axis.

Therefore in the present embodiment, as shown in FIGS. 1, 4A and 4B, the first to fourth movable electrodes 24 to 27 and the first to fourth fixed electrodes 32 to 62 are formed to be inclined with respect to the x-axis direction and the y-axis direction (detection axes) in advance so that the cross-axis sensitivity can be cancelled. Specifically, as shown in FIGS. 1 and 4A, the first and second movable electrodes 24, 25 and the first and second fixed electrodes 32, 42 are formed such that an angle $\theta$ formed by the extended direction thereof and the y-axis direction (detection axis) is $\sin^{-1}(d/L)$[deg], and the third and fourth movable electrodes 26, 27 and the third and fourth fixed electrodes 52, 62 are formed such that an angle $\theta$ formed by the extended direction thereof and the x-axis direction (detection axis) is $\sin^{-1}(d/L)$[deg].

As shown in FIGS. 1 and 4A, the first and second movable electrodes 24, 25 and the first and second fixed electrodes 32, 42 are formed such that, when the acceleration in the y-axis direction is applied and the first and second movable electrodes 24, 25 are displaced, an increase/decrease in the length (area) of the section where each of the first and second movable electrodes 24, 25 faces each of the first and second fixed electrodes 32, 42 matches an increase/decrease in the interval between each of the first and second movable electrodes 24, 25 and each of the first and second fixed electrodes 32, 42. For example, the first and second movable electrodes 24, 25 and the first and second fixed electrodes 32, 42 are formed such that, when the acceleration in the direction along the y-axis direction from the third fixed portion 50 to the first fixed portion 30 (the direction from below to above in the paper of FIG. 1) is applied and the first and second movable electrodes 24, 25 are displaced, the length (area) of the section where the first movable electrode 24 faces the first fixed electrode 32 increases while the length (area) of the section where the second movable electrode 25 faces the second fixed electrode 42 decreases, and the interval between the first movable electrode 24 and the first fixed electrode 32 becomes wider (increases) while the interval between the second movable electrode 25 and the second fixed electrode 42 becomes narrower (decreases).

Similarly, the third and fourth movable electrodes 26, 27 and the third and fourth fixed electrodes 52, 62 are formed such that, when the acceleration in the x-axis direction is applied and the third and fourth movable electrodes 26, 27 are displaced, an increase/decrease in the length (area) of the section where each of the third and fourth movable electrodes 26, 27 faces each of the third and fourth fixed electrodes 52, 62 matches an increase/decrease in the interval between each of the third and fourth movable electrodes 26, 27 and each of the third and fourth fixed electrodes 52, 62. For example, the third and fourth movable electrodes 26, 27 and the third and fourth fixed electrodes 52, 62 are formed such that, when the acceleration in the direction from the third fixed portion 50 to the second fixed portion 40 (the direction from left to right in the paper of FIG. 1) and the third and fourth movable electrodes 26, 27 are displaced, the length (area) of the section where the third movable electrode 26 faces the third fixed electrode 52 increases while the length (area) of the section where the fourth movable electrode 27 faces the fourth fixed electrode 62 decreases, and the interval between the third movable electrode 26 and the third fixed electrode 52 becomes wider (increases) while the interval between the fourth movable electrode 27 and the fourth fixed electrode 62 becomes narrower (decreases).

That is, when a dielectric constant is ∈, and an area of facing electrodes is S, and an interval of facing electrodes is d, the capacitance C is represented by: C=∈·(S/d). Hence it is configured such that, when the first to fourth movable electrodes 24 to 27 and the first to fourth fixed electrodes 32 to 62 are inclined, the increase/decrease of the area S of the facing electrodes and the interval d of the facing electrodes match, to thereby inhibit the occurrence of a capacitance change due to the inclination of the electrodes.

Figure 5:
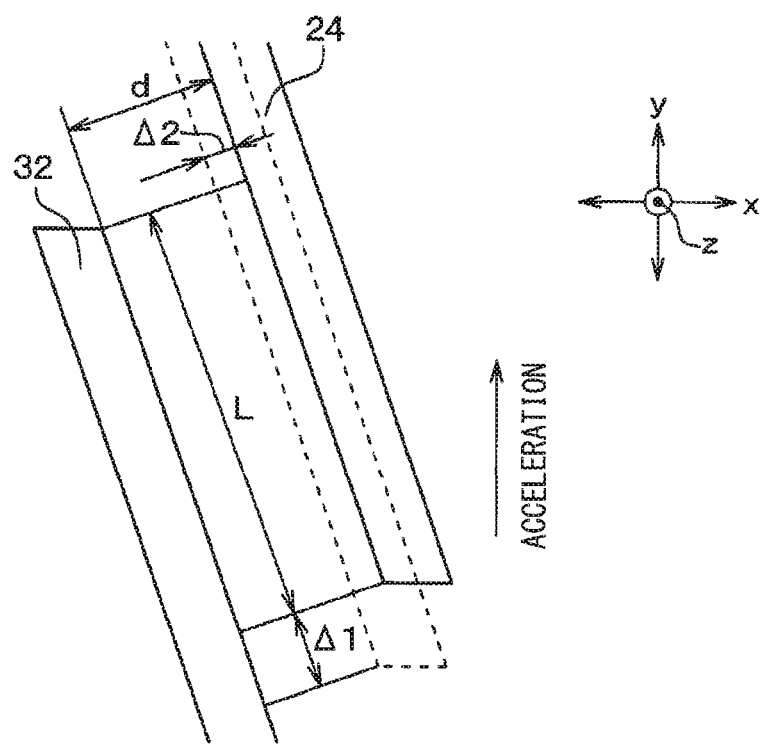
FIG. 5 is a diagram showing a state upon application of acceleration at the time when the first movable electrode and the first fixed electrode are inclined reversely to each other.

That is, when the first to fourth movable electrodes 24 to 27 and the first to fourth fixed electrodes 32 to 62 are inclined opposite to in FIG. 1 with respect to the x-axis direction and the y-axis direction, for example, the relation between the first movable electrode 24 and the first fixed electrode 32 is as shown in FIG. 5. In this case, when the acceleration from below toward above in the paper of FIG. 5 (from below to above in the paper of FIG. 1) is applied, the length (area) of the section where the first movable electrode 24 faces the first fixed electrode 32 increases by Δ1, and the interval between the first movable electrode 24 and the first fixed electrode 32 becomes narrower by Δ2. Thus, when the electrodes are inclined in this manner, the cross-axis sensitivity has a larger influence. In FIG. 5, the state of the first movable electrode 24 upon application of the acceleration is indicated by a dotted line.

Figure 6:
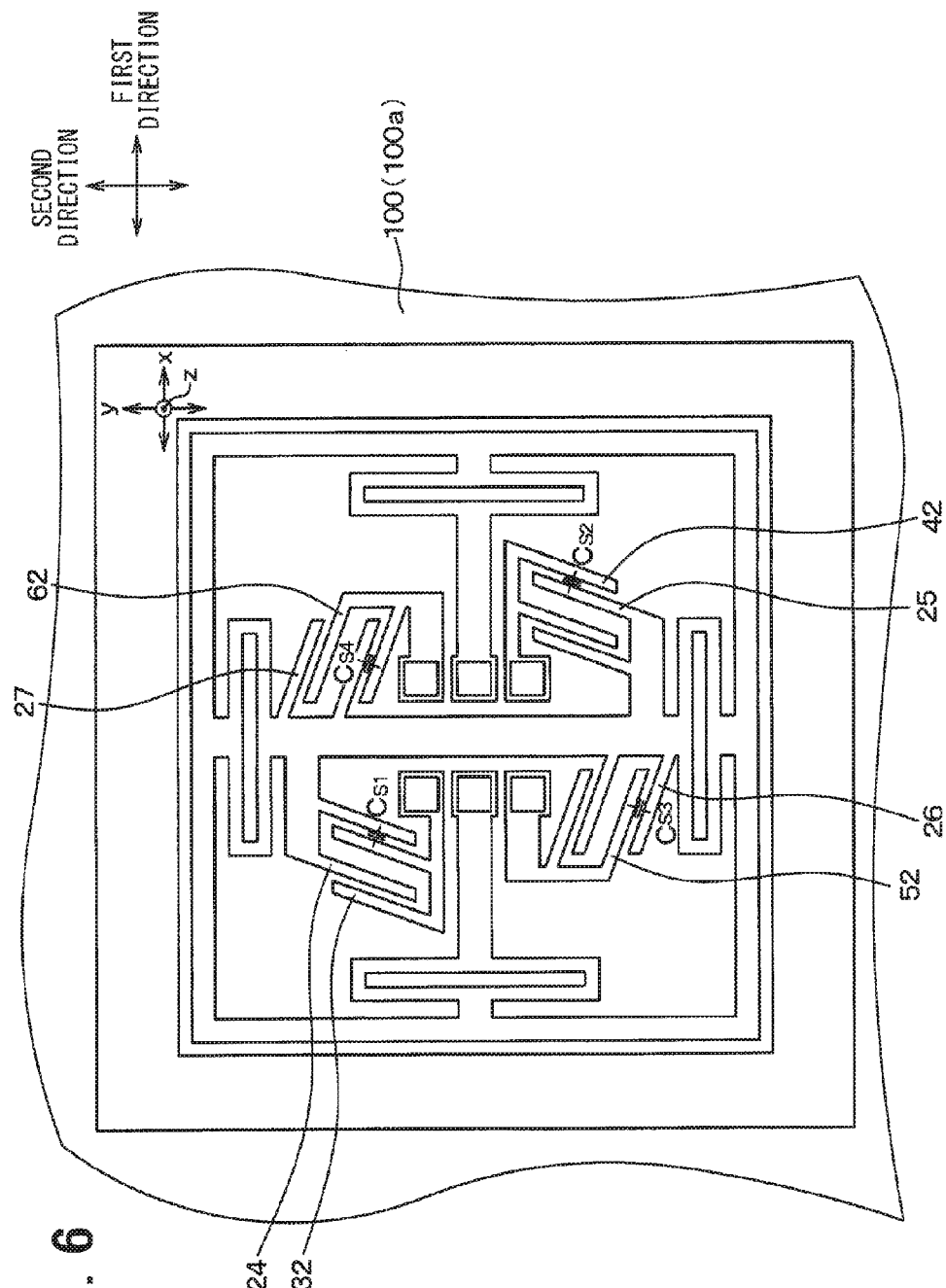
FIG. 6 is a plan view at the time when the acceleration sensor shown in FIG. 1 is mounted on a mount member.

The above description is the configuration of the acceleration sensor in the present embodiment. As shown in FIG. 6, the acceleration sensor as thus described is mounted on one surface 100a of a mount member 100 such as a case via art adhesive, not shown. Specifically, the acceleration sensor is mounted such that the first and second directions, which are orthogonal to each other and in which acceleration in the surface direction of the one surface 100a of the mount member 100 is to be detected, match the x-axis direction and the y-axis direction of the acceleration sensor.

As described above, in the present embodiment, the angle θ formed by the extended direction of the first and second movable electrodes 24, 25 and the first and second fixed electrodes 32, 42 and the y-axis direction (the second direction of the mount member 100) is $\sin^{-1}(d/L)$[deg], and the angle θ formed by the extended direction of the third and fourth movable electrodes 26, 27 and the third and fourth fixed electrodes 52, 62 and the x-axis direction (the first direction of the mount member 100) is $\sin^{-1}(d/L)$[deg]. Further, the first and second movable electrodes 24, 25 and the first and second fixed electrodes 32, 42 are formed such that, when the acceleration in the y-axis direction is applied and the first and second movable electrodes 24, 25 are displaced, the increase/decrease in the length (area) of the section where each of the first and second movable electrodes 24, 25 faces each of the first and second fixed electrodes 32, 42 matches the increase/decrease in the interval between each of the first and second movable electrodes 24, 25 and each of the first and second fixed electrodes 32, 42. Similarly, the third and fourth movable electrodes 26, 27 and the third and fourth fixed electrodes 52, 62 are formed such that, when the acceleration in the x-axis direction is applied and the third and fourth movable electrodes 26, 27 are displaced, the increase/decrease in the length (area) of the section where each of the third and fourth movable electrodes 26, 27 faces each of the third and fourth fixed electrodes 52, 62 matches the increase/decrease in the interval between each of the third and fourth movable electrodes 26, 27 and each of the third and fourth fixed electrodes 52, 62. It may be thus possible to reduce the influence of the cross-axis sensitivity and inhibit the reduction in detection accuracy.

(Second Embodiment)

A second embodiment of the present disclosure will be described. In the present embodiment, with respect to the first embodiment, as for each of the first to fourth fixed electrodes 32 to 62 sandwiched between two each of the first to fourth movable electrodes 24 to 27, a capacitance formed between each of the first to fourth fixed electrodes 32 to 62 and each of the first to fourth movable electrodes 24 to 27 apart therefrom is considered with respect to the first embodiment. The other respects are similar to those in the first embodiment, and descriptions thereof are omitted here.

In the acceleration sensor of the present embodiment, basic configurations of the movable portion 20 and the first and second fixed portions 30, 40 are similar to those in FIG. 1 above, but the angles formed by each of the first to fourth movable electrodes 24 to 27 or each of the first to fourth fixed electrodes 32 to 62 and the x-axis direction or the y-axis direction is changed.

Here, as in the above first embodiment, states of the conventional acceleration sensor upon application of acceleration are described with reference to FIGS. 7A to 7D.

In FIGS. 7A to 7D, when the acceleration is not applied to the first to fourth fixed electrodes J32 to J62, movable electrodes close to the first to fourth fixed electrodes J32 to J62 are referred to as first to fourth movable electrodes J24a to J27a, and movable electrodes more apart from the fixed electrodes than the first to fourth movable electrodes J24a to J27a are referred to as first to fourth movable electrodes J24b to J27b. Further, the states of the first to fourth movable electrodes J24a, J24b to J27a, J27b upon application of the acceleration are indicated by dotted lines. The first to fourth movable electrodes J24a, J24b to J27a, J27b are provided in the weight portion 21 basically as in FIG. 1 above, and disposed in a relation similar to that in FIG. 1 above.

When an interval between each of the first to fourth movable electrodes J24a to J27a and two each of the first to fourth fixed electrodes J32 to J62 is d1 and an interval between each of the first to fourth movable electrodes J24b to J27b and two each of the first to fourth fixed electrodes J32 to J62 is d2, initial capacitances of the first to fourth capacitances $C_{s1}$ to $C_{s4}$ are respectively represented by Expression 5.

(Expression 5)

$$C_{S1} \sim C_{S4} = \varepsilon \cdot \frac{L \cdot t_{SOI}}{d1} + \varepsilon \cdot \frac{L \cdot t_{SOI}}{d2} \qquad \text{(Expression 5)}$$

That is, in the present embodiment, as for each of the first to fourth fixed electrodes J32 to J62 sandwiched between two each of the first to fourth movable electrodes J24a, J24b to J27a, J27b, there is also considered a capacitance formed between each of the first to fourth fixed electrodes J32 to J62 and each of the first to fourth movable electrodes J24b to J27b with an interval therebetween being wider than an interval between each of the first to fourth fixed electrodes J32 to J62 and each of the first to fourth movable electrodes J24a to J27a. As shown in FIGS. 7A to 7D, it is assumed that the acceleration is applied in the direction parallel to the x-axis direction, as well as the direction from the first fixed electrode J32 to the first movable electrode J24a (from left to right in the paper of FIG. 7A to 7D).

At this time, as shown in FIG. 7A, the interval between the first movable electrode J24a and the first fixed electrode J32 decreases by $\Delta$ to become d1$-\Delta$, and the interval between the first movable electrode J24b and the first fixed electrode J32 increases by $\Delta$ to become d2+$\Delta$. Further, as shown in FIG. 7B, the interval between the second movable electrode J25a and the second fixed electrode J42 increases by $\Delta$ to become d1+$\Delta$, and the interval between the second movable electrode J25b and the second fixed electrode J42 decreases by $\Delta$ to become d2$-\Delta$.

Figure 7C:
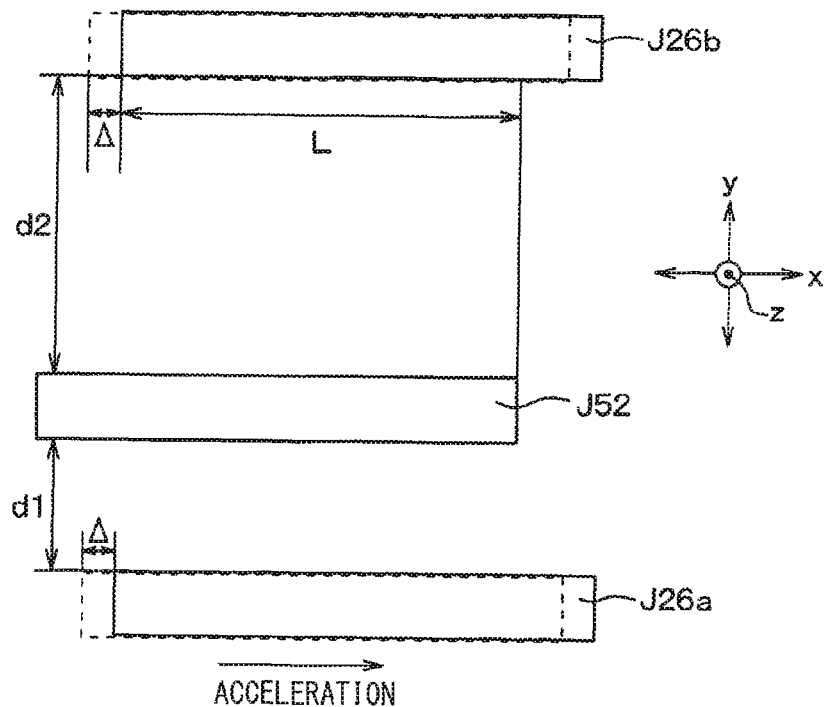
FIG. 7C is a diagram showing states of third movable electrodes and the third fixed electrode upon application of the acceleration in the conventional acceleration sensor.
Figure 7D:
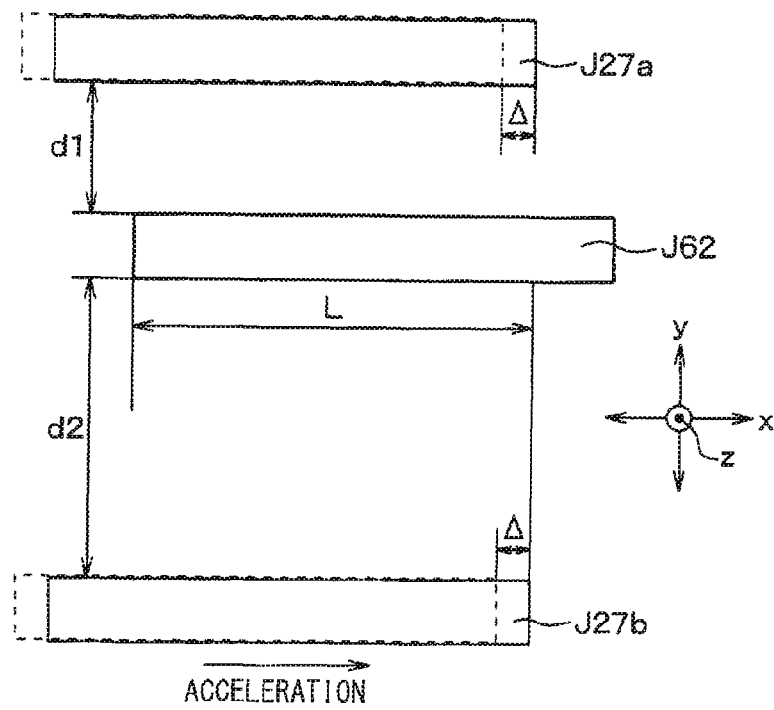
FIG. 7D is a diagram showing states of fourth movable electrodes and the fourth fixed electrode upon application of the acceleration in the conventional acceleration sensor.

Meanwhile, as shown in FIG. 7C, a length of a section where each of the third movable electrodes J26a, J26b faces the third fixed electrode J52 increases by $\Delta$ to become L+$\Delta$. Further, as shown in FIG. 7D, a length of a section where each of the fourth movable electrode J27a, J27b faces the fourth fixed electrode J62 decreases by $\Delta$ to become L$-\Delta$. With the description given here of the case where the acceleration along the x-axis direction has been applied, $\Delta Cx$ to be the sensitivity is represented by Expression 6 below, and $\Delta Cy$ to be the cross-axis sensitivity is represented by Expression 7 below. As described above, normally, the displacement amount $\Delta$ of each of the first to fourth movable electrodes J24a, J24b to J27a, J27b upon application of the acceleration is sufficiently small as compared with the length L of the section where each of the first to fourth movable electrodes J24a, J24b to J27a, J27b faces each of the first to fourth fixed electrodes J32 to J62.

(Expression 6)

$$\Delta Cx = C_{S1} - C_{S2} \quad \text{(Expression 6)}$$
$$= \left(\varepsilon \cdot \frac{L \cdot t_{SOI}}{d1 - \Delta} + \varepsilon \cdot \frac{L \cdot t_{SOI}}{d2 + \Delta}\right) - \left(\varepsilon \cdot \frac{L \cdot t_{SOI}}{d1 + \Delta} + \varepsilon \cdot \frac{L \cdot t_{SOI}}{d2 - \Delta}\right)$$
$$= \varepsilon \cdot t_{SOI} \left(\frac{2 \cdot L \cdot \Delta}{d1^2 - \Delta^2} - \frac{2 \cdot L \cdot \Delta}{d2^2 - \Delta^2}\right)$$
$$= \varepsilon \cdot t_{SOI} \left(\frac{2 \cdot L \cdot \Delta}{d1^2} - \frac{2 \cdot L \cdot \Delta}{d2^2}\right)$$

(Expression 7)

$$\Delta Cy = C_{S3} - C_{S4} \quad \text{(Expression 7)}$$
$$= \left(\varepsilon \cdot \frac{(L+\Delta) \cdot t_{SOI}}{d1} + \varepsilon \cdot \frac{(L+\Delta) \cdot t_{SOI}}{d2}\right) -$$
$$\left(\varepsilon \cdot \frac{(L-\Delta) \cdot t_{SOI}}{d1} + \varepsilon \cdot \frac{(L-\Delta) \cdot t_{SOI}}{d2}\right)$$
$$= \varepsilon \cdot t_{SOI}\left(\frac{2 \cdot \Delta}{d1} + \frac{2 \cdot \Delta}{d2}\right)$$

When d2=a·d1 (a is a constant), "cross-axis sensitivity/sensitivity" is represented by Expression 8:

(Expression 8)

$$\frac{\Delta Cy}{\Delta Cx} = \frac{d1 \cdot d2}{L(d2 - d1)} \quad \text{(Expression 8)}$$
$$= \frac{a \cdot d1}{L(a - 1)}$$

Hence, in the present embodiment, in FIG. 4A, the first and second movable electrodes 24, 25 and the first and second fixed electrodes 32, 42 are formed such that the angle θ formed by the extended direction thereof and the y-axis direction (detection axis) is $\sin^{-1}\{a \cdot d1/L(a-1)\}$[deg]. Further, in FIG. 4B, the third and fourth movable electrodes 26, 27 and the third and fourth fixed electrodes 52, 62 are formed such that the angle θ formed by the extended direction thereof and the x-axis direction (detection axis) is $\sin^{-1}\{a \cdot d1/L(a-1)\}$[deg].

Also in the present embodiment, the first and second movable electrodes 24, 25 and the first and second fixed electrodes 32, 42 are formed such that, when the acceleration in the y-axis direction is applied and the first and second movable electrodes 24, 25 are displaced, the increase/decrease in the length (area) of the section where each of the first and second movable electrodes 24, 25 faces each of the first and second fixed electrodes 32, 42 matches the increase/decrease in the interval between each of the first and second movable electrodes 24, 25 and each of the first and second fixed electrodes 32, 42. Similarly, the third and fourth movable electrodes 26, 27 and the third and fourth fixed electrodes 52, 62 are formed such that, when the acceleration in the x-axis direction is applied and the third and fourth movable electrodes 26, 27 are displaced, the increase/decrease in the length (area) of the section where each of the third and fourth movable electrodes 26, 27 faces each of the third and fourth fixed electrodes 52, 62 matches the increase/decrease in the interval between each of the third and fourth movable electrodes 26, 27 and each of the third and fourth fixed electrodes 52, 62.

As described above, in the present embodiment, the first to fourth fixed electrodes 32 to 62 and the first to fourth movable electrodes 24 to 27 are inclined considering a capacitance formed between each of the first to fourth fixed electrodes 32 to 62 and two each of the first to fourth movable electrodes 24 to 27 which sandwich each of the first to fourth fixed electrodes 32 to 62. Thus, it may be possible to further inhibit the reduction in detection accuracy.

(Third Embodiment)

A third embodiment of the present disclosure will be described. In the present embodiment, with respect to the first embodiment, the extended direction of the first to fourth movable electrodes 24 to 27 and the extended direction of the first to fourth fixed electrodes 32 to 62 are made to match the x-axis direction and the y-axis direction of the SOI substrate 14. The other respects are similar to those in the first embodiment, and descriptions thereof are omitted here.

Figure 8:
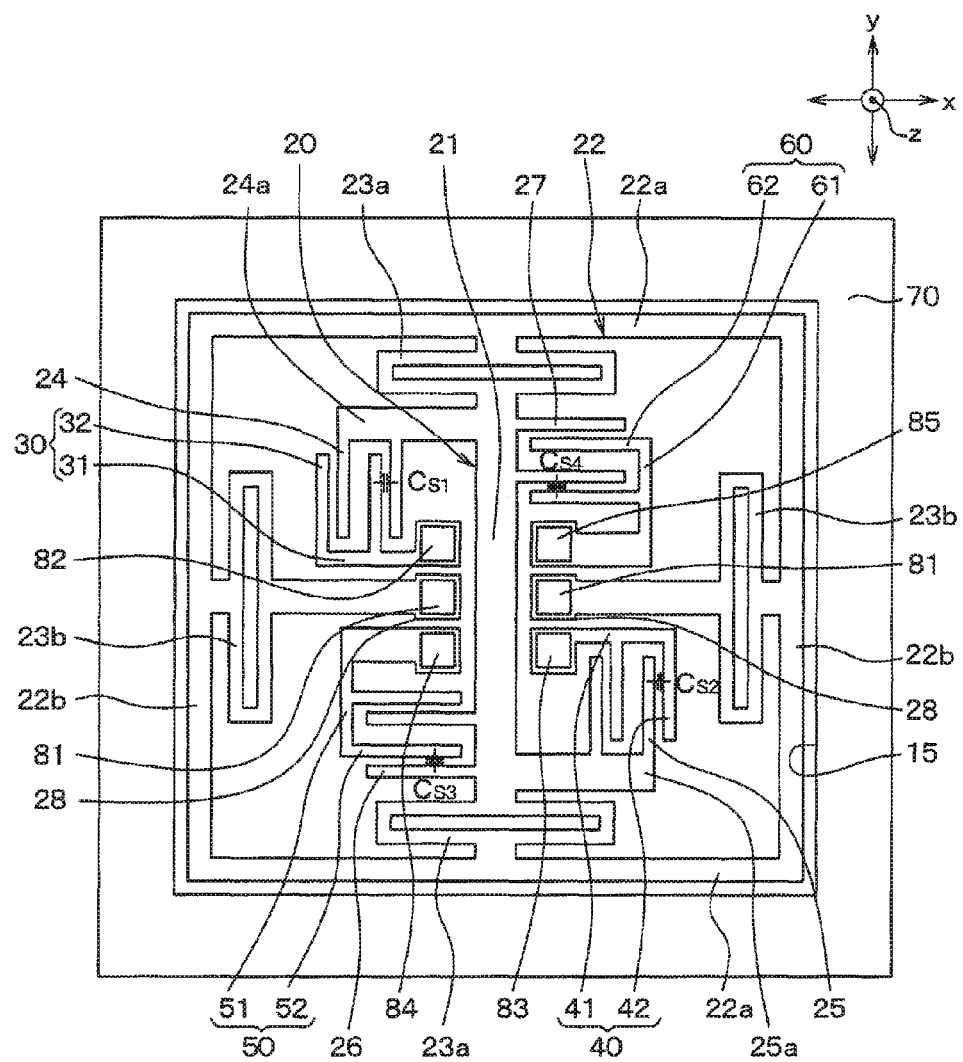
FIG. 8 is a plan view of an acceleration sensor according to a third embodiment.

As shown in FIG. 8, in the acceleration sensor of the present embodiment, the first and second movable electrodes 24, 25 and the first and second fixed electrodes 32, 42 are extended along the direction parallel to the y-axis direction of the SOI substrate 14. That is, the angle formed by each of the first and second movable electrodes 24, 25 and the first and second fixed electrodes 32, 42 and the y-axis direction is 0. Further, the third and fourth movable electrodes 26, 27 and the third and fourth fixed electrodes 52, 62 are extended along the direction parallel to the x-axis direction of the SOI substrate 14. That is, the angle of each of the third and fourth movable electrodes 26, 27 and the third and fourth fixed electrodes 52, 62 and the x-axis direction is 0.

When such an acceleration sensor is mounted on the one surface 100a of the mount member 100 such that the first and second directions of the mount member 100 match the x-axis direction and the y-axis direction of the acceleration sensor, the cross-axis sensitivity is generated as described in FIGS. 3A to 3D above and Expressions 1 to 4 above. Note that the first and second directions of the mount member 100 are directions in which acceleration is to be detected in the surface direction of the one surface 100a of the mount member 100.

Figure 9:
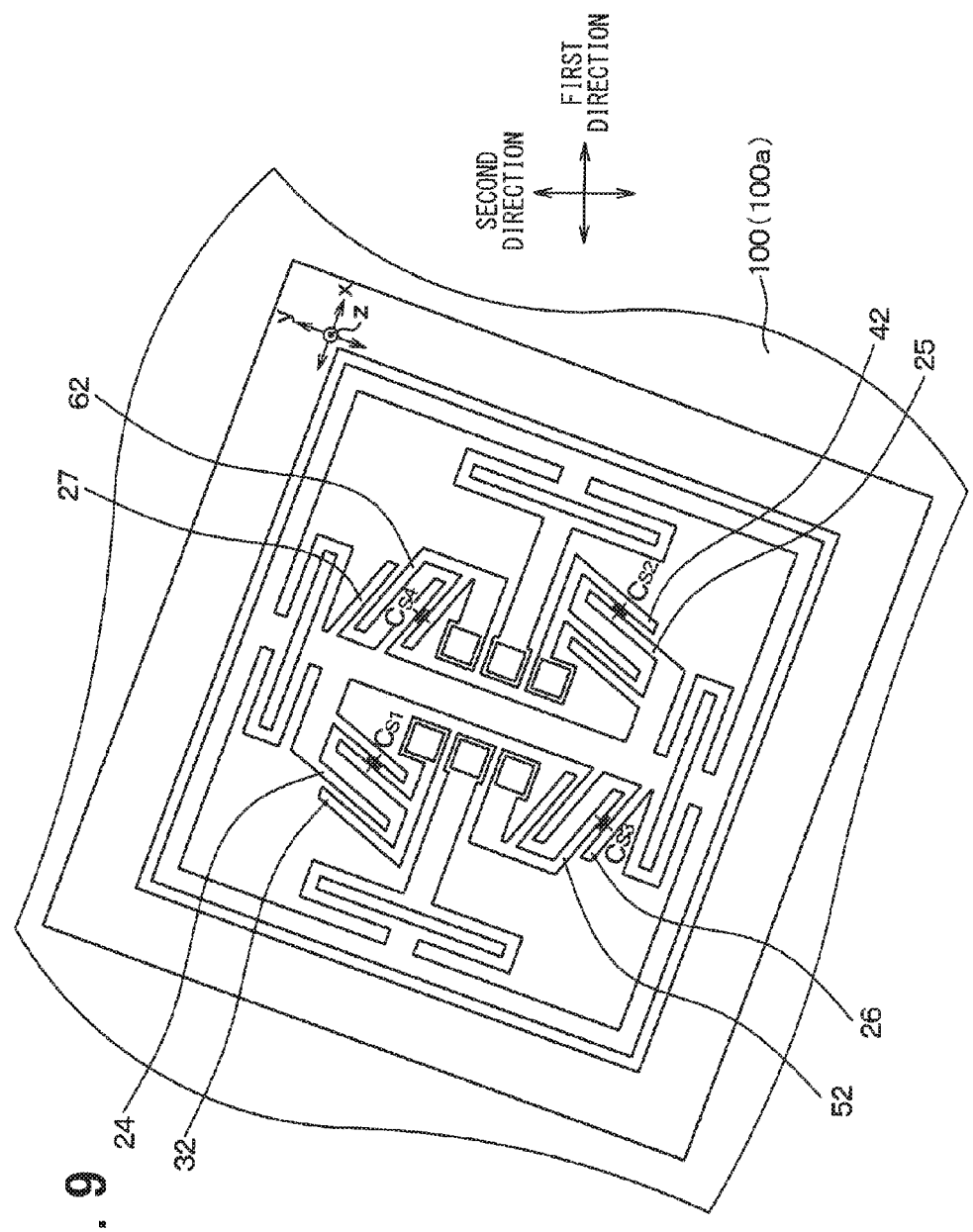
FIG. 9 is a plan view at the time when the acceleration sensor shown in FIG. 8 is mounted on the mount member.

Hence in the present embodiment, as shown in FIG. 9, the acceleration sensor is mounted on the one surface 100a of the mount member 100 such that the angle formed by the extended direction of the first and second movable electrodes 24, 25 and the first and second fixed electrodes 32, 42 (the y-axis direction of the SOI substrate 14) and the first direction (detection axis) of the mount member 100 is $\sin^{-1}(d/L)$[deg], and the angle formed by the extended direction of the third and fourth movable electrodes 26, 27 and the third and fourth fixed electrodes 52, 62 (the x-axis direction of the SOI substrate 14) and the second direction (detection axis) of the mount member 100 is $\sin^{-1}(d/L)$[deg].

Also in the present embodiment, the first and second movable electrodes 24, 25 and the first and second fixed electrodes 32, 42 are disposed such that, when the acceleration in the second direction in the mount member 100 is applied and the first and second movable electrodes 24, 25 are displaced, the increase/decrease in the length (area) of the section where each of the first and second movable electrodes 24, 25 faces each of the first and second fixed electrodes 32, 42 matches the increase/decrease in the interval between each of the first and second movable electrodes 24, 25 and each of the first and second fixed electrodes 32, 42. Similarly, the third and fourth movable electrodes 26, 27 and the third and fourth fixed electrodes 52, 62 are disposed such that, when the acceleration in the first direction of the mount member 100 is applied and the third and fourth movable electrodes 26, 27 are displaced, the increase/decrease in the length (area) of the section where each of the third and fourth movable electrodes 26, 27 faces each of the third and fourth fixed electrodes 52, 62 matches the increase/decrease in the interval between each of the third and fourth movable electrodes 26, 27 and each of the third and fourth fixed electrodes 52, 62.

As described above, even in the acceleration sensor in which the first to fourth movable electrodes 24 to 27 and the first to fourth fixed electrodes 32 to 62 are extended in the direction parallel to the x-axis direction or the y-axis direction of the SOI substrate 14, a similar effect to that in the first embodiment can be obtained by mounting the acceleration sensor on the one surface 100a of the mount member 100 such that the angle formed by the extended direction of the first and second movable electrodes 24, 25 and the first and second fixed electrodes 32, 42 (the y-axis direction of the SOI substrate 14) and the first direction of the mount member 100 is $\sin^{-1}(d/L)$[deg], and the angle formed by the extended direction of the third and fourth movable electrodes 26, 27 and the third and fourth fixed electrodes 52, 62 (the x-axis direction of the SOI substrate 14) and the second direction of the mount member 100 is $\sin^{-1}(d/L)$[deg].

(Other Embodiments)

The present disclosure is not restricted to the embodiments described above, but can be changed as appropriate within the scope described in the present disclosure.

For example, in each of the above embodiments, the first and second beam portions 23a, 23b may be configured of a material having a spring feature in a folded-line shape.

In each of the above embodiments, the frame portion 22 may not have the rectangular frame shape, but have an annular shape.

Further, in each of the above embodiments, the center of the frame portion 22 may not match the center of the support substrate 11.

In each of the above embodiments, the acceleration sensor may only have the first and third movable electrodes 24, 26 and the first and third fixed electrodes 32, 52. That is, the acceleration in the x-axis direction may be detected based on the first capacitance $C_{s1}$, and the acceleration in the y-axis direction may be detected based on the third capacitance $C_{s3}$.

Further, each of the above embodiments may be combined as appropriate. That is, the second embodiment may be combined with the third embodiment, and the acceleration sensor of the third embodiment may be mounted on the one surface 100a of the mount member 100 such that the angle formed by the extended direction of the first and second movable electrodes 24, 25 and the first and second fixed electrodes 32, 42 (the y-axis direction of the SOT substrate 14) and the first direction of the mount member 100 is $\sin^{-1}\{a\cdot d1/L(a-1)\}$[deg], and the angle formed by the extended direction of the third and fourth movable electrodes 26, 27 and the third and fourth fixed electrodes 52, 62 (the x-axis direction of the SOI substrate 14) and the second direction of the mount member 100 is $\sin^{-1}\{a\cdot d1/L(a-1)\}$[deg].

In the present disclosure, the first to fourth fixed portions 30 to 60 represent the first fixed portion 30, the second fixed portion 40, the third fixed portion 50, and the fourth fixed portion 60. Similarly, the first and second beam portions 23a, 23b represent the first beam portion 23a and the second beam portion 23b. The first to fourth movable electrodes 24 to 27 represent the first movable electrode 24, the second movable electrode 25, the third movable electrode 26, and the fourth movable electrode 27. The first and second movable electrodes 24, 25 represent the first movable electrode 24 and the second movable electrode 25. The third and fourth movable electrodes 26, 27 represent the third movable electrode 26 and the fourth movable electrode 27. The first and second support portions 24a, 25a represent the first support portion 24a and the second support portion 25a. The first to fourth wiring portions 31 to 61 represent the first wiring portion 31, the second wiring portion 41, the third wiring portion 51, and the fourth wiring portion 61. The first to fourth fixed electrodes 32 to 62 represent the first fixed electrode 32, the second fixed electrode 42, the third fixed electrode 52, and the fourth fixed electrode 62. The first and second capacitances $C_{s1}$, $C_{s2}$ represent the first capacitance $C_{s1}$ and the second capacitance $C_{s2}$. The third and fourth capacitances $C_{s3}$, $C_{s4}$ represent the third capacitance $C_{s3}$ and the fourth capacitance $C_{s4}$. The first to fourth capacitances $C_{s1}$ to $C_{s4}$ represent the first capacitance $C_{s1}$, the second capacitance $C_{s2}$, the third capacitance $C_{s3}$, and the fourth capacitance $C_{s4}$. The first to fourth movable electrodes J24 to J27 represent the first movable electrode J24, the second movable electrode J25, the third fixed electrode J26, and the fourth movable electrode J27. The first to fourth fixed electrodes J32 to J62 represent the first fixed electrode J32, the second fixed electrode J42, the third fixed electrode J52, and the fourth fixed electrode J62. The first to fourth movable electrodes J24a to J27a represent the first movable electrode J24a, the second movable electrode J25a, the third movable electrode J26a, and the fourth movable electrode J27a. The first to fourth movable electrodes J24b to J27b represent the first movable electrode J24b, the second movable electrode J25b, the third movable electrode J26b, and the fourth movable electrode J27b.

In the above, the embodiments, configurations, and aspects of the acceleration sensor and the mounting structure of the acceleration sensor according to the present disclosure have been illustrated. However, the embodiments, configurations, and aspects according to the present disclosure are not restricted to the foregoing embodiments, configurations, and aspects. For example, an embodiment, configuration, and aspect obtained by appropriately combining technical portions respectively disclosed in different embodiments, configurations, and aspects are also included in the scopes of the embodiment, configuration, and aspect according to the present disclosure.

The invention claimed is:

1. An acceleration sensor comprising:
a semiconductor substrate that includes a support substrate and a semiconductor layer stacked on the support substrate;
a first-direction movable electrode that is provided in the semiconductor layer and extended in one direction of a surface direction on the semiconductor substrate;
a second-direction movable electrode that is provided in the semiconductor layer and extended in another direction orthogonal to the one direction and parallel to the surface direction;
a first-direction fixed electrode that is provided in the semiconductor layer and placed to face the first-direction movable electrode;
a second-direction fixed electrode that is provided in the semiconductor layer and placed to face the second-direction movable electrode; and
a support member that is provided in the semiconductor layer, is provided with the first-direction movable electrode and the second-direction movable electrode, and integrally displaces the first-direction movable electrode and the second-direction movable electrode in accordance with acceleration,
the acceleration sensor being configured to detect acceleration in a first direction in the surface direction of the semiconductor substrate and acceleration in a second direction orthogonal to the first direction and parallel to the surface direction,
wherein:
when each length of a section where the first-direction movable electrode faces the first-direction fixed electrode and where the second-direction movable electrode faces the second-direction fixed electrode is L, and each interval between the first-direction movable electrode and the first-direction fixed electrode and between the second-direction movable electrode and the second-direction fixed electrode is d,
the first-direction movable electrode and the first-direction fixed electrode are provided such that an angle formed by an extended direction of the first-direction movable electrode and the first-direction fixed electrode and the second direction is $\sin^{-1}(d/L)$[deg], and at a time when the acceleration in the second direction is applied and the first-direction movable electrode is displaced, an increase/decrease in the length of the section where the first-direction movable electrode faces the first-direction fixed electrode matches an increase/decrease in the interval between the first-direction movable electrode and the first-direction fixed electrode, and
the second-direction movable electrode and the second-direction fixed electrode are provided such that an angle formed by an extended direction of the second-direction movable electrode and the second-direction fixed electrode and the first direction is $\sin^{-1}(d/L)$[deg], and at a time when the acceleration in the first direction is applied and the second-direction movable electrode is displaced, an increase/decrease in the length of the section where the second-direction movable electrode faces the second-direction fixed electrode matches an increase/decrease in the interval between the second-direction movable electrode and the second-direction fixed electrode.

2. An acceleration sensor comprising:
a semiconductor substrate that includes a support substrate and a semiconductor layer stacked on the support substrate;
a plurality of first-direction movable electrodes that are provided in the semiconductor layer and extended in one direction of a surface direction on the semiconductor substrate;
a plurality of second-direction movable electrodes that are provided in the semiconductor layer and extended in another direction orthogonal to the one direction and parallel to the surface direction;
at least one first-direction fixed electrode that is provided in the semiconductor layer and placed to face the first-direction movable electrodes, and sandwiched between the plurality of first-direction movable electrodes;
at least one second-direction fixed electrode that is provided in the semiconductor layer and placed to face the second-direction movable electrodes, and sandwiched between the plurality of second-direction movable electrodes; and
a support member that is provided in the semiconductor layer, is provided with the first-direction movable electrodes and the second-direction movable electrodes, and integrally displaces the first-direction movable electrodes and the second-direction movable electrodes in accordance with acceleration,
the acceleration sensor being configured to detect acceleration in a first direction in the surface direction of the semiconductor substrate and acceleration in a second direction orthogonal to the first direction and parallel to the surface direction,
wherein:
when each length of a section where the first-direction movable electrodes face the first-direction fixed electrode and where the second-direction movable electrodes face the second-direction fixed electrode is L, each interval between the first-direction fixed electrode and one of pair of the first-direction movable electrodes that sandwich the first-direction fixed electrode and between the second-direction fixed electrode and one of pair of the second-direction movable electrodes that sandwich the second-direction fixed electrode is d1, and each interval between the first-direction fixed electrode and another of the pair of the first-direction movable electrodes that sandwich the first-direction fixed electrode and between the second-direction fixed electrode and another of the pair of the second-direction movable electrodes that sandwich the second-direction fixed electrode is a·d1,
the first-direction movable electrodes and the first-direction fixed electrode are provided such that an angle formed by an extended direction of the first-direction movable electrodes and the first-direction fixed electrode and the second direction is $\sin^{-1}\{a\cdot d1/L(a-1)\}$[deg], and at a time when the acceleration in the second direction is applied and the first-direction movable electrodes are displaced, an increase/decrease in the length of the section where the first-direction movable electrodes face the first-direction fixed electrode matches an increase/decrease in the interval between the first-direction movable electrodes and the first-direction fixed electrode, and the second-direction movable electrodes and the second-direction fixed electrode are provided such that an angle formed by an extended direction of the second-direction movable electrodes and the second-direction fixed electrode and the first direction is $\sin^{-1}(a \cdot d1/L(a-1))$[deg], and at a time when the acceleration in the first direction is applied and the second-direction movable electrodes are displaced, an increase/decrease in the length of the section where the second-direction movable electrodes face the second-direction fixed electrode matches an increase/decrease in the interval between the second-direction movable electrodes and the second-direction fixed electrode.

3. A mounting structure of an acceleration sensor, the mounting structure comprising the acceleration sensor that includes:
a semiconductor substrate that includes a support substrate and a semiconductor layer stacked on the support substrate;
a first-direction movable electrode that is provided in the semiconductor layer and extended in one direction of a surface direction on the semiconductor substrate;
a second-direction movable electrode that is provided in the semiconductor layer and extended in another direction orthogonal to the one direction and parallel to the surface direction on the semiconductor substrate;
a first-direction fixed electrode that is provided in the semiconductor layer and placed to face the first-direction movable electrode;
a second-direction fixed electrode that is provided in the semiconductor layer and placed to face the second-direction movable electrode; and
a support member that is provided in the semiconductor layer, is provided with the first-direction movable electrode and the second-direction movable electrode, and integrally displaces the first-direction movable electrode and the second-direction movable electrode in accordance with acceleration,
the acceleration sensor being mounted on one surface of a mount member so as to detect acceleration in a first direction in a surface direction of the one surface of the mount member and acceleration in a second direction orthogonal to the first direction and parallel to the surface direction of the one surface of the mount member,
wherein:
when each length of a section where the first-direction movable electrode faces the first-direction fixed electrode and where the second-direction movable electrode faces the second-direction fixed electrode is L, and each interval between the first-direction movable electrode and the first-direction fixed electrode and between the second-direction movable electrode and the second-direction fixed electrode is d,
the acceleration sensor is mounted on the one surface of the mount member such that an angle formed by an extended direction of the first-direction movable electrode and the first-direction fixed electrode and the second direction of the mount member is $\sin^{-1}(d/L)$[deg], and at a time when the acceleration in the second direction is applied and the first-direction movable electrode is displaced, an increase/decrease in the length of the section where the first-direction movable electrode faces the first-direction fixed electrode matches an increase/decrease in the interval between the first-direction movable electrode and the first-direction fixed electrode, and an angle formed by an extended direction of the second-direction movable electrode and the second-direction fixed electrode and the first direction of the mount member is $\sin^{-1}(d/L)$[deg], and at a time when the acceleration in the first direction is applied and the second-direction movable electrode is displaced, an increase/decrease in the length of the section where the second-direction movable electrode faces the second-direction fixed electrode matches an increase/decrease in the interval between the second-direction movable electrode and the second-direction fixed electrode.

4. The mounting structure of the acceleration sensor according to claim 3, wherein:
when the one direction in the surface direction of the semiconductor substrate is defined as a first direction and a direction orthogonal to the first direction and parallel to the surface direction of the semiconductor substrate is defined as a second direction,
the angle formed by the extended direction of the first-direction movable electrode and the first-direction fixed electrode and the second direction of the semiconductor substrate is $\sin^{-1}(d/L)$[deg], and the angle formed by the extended direction of the second-direction movable electrode and the second-direction fixed electrode and the first direction of the semiconductor substrate is $\sin^{-1}(d/L)$[deg]; and
the acceleration sensor is mounted on the one surface of the mount member such that the first direction and the second direction of the semiconductor substrate are respectively parallel to the first direction and the second direction of the mount member.

5. The mounting structure of the acceleration sensor according to claim 3, wherein:
when the one direction in the surface direction of the semiconductor substrate is defined as a first direction and a direction orthogonal to the first direction and parallel to the surface direction of the semiconductor substrate is defined as a second direction,
the extended direction of the first-direction movable electrode and the first-direction fixed electrode and the second direction of the semiconductor substrate are parallel to each other, and the extended direction of the second-direction movable electrode and the second-direction fixed electrode and the first direction of the semiconductor substrate are parallel to each other; and
the acceleration sensor is mounted on the one surface of the mount member such that the angle formed by each of the first direction and the second direction of the semiconductor substrate and the first direction and the second direction of the mount member is $\sin^{-1}(d/L)$[deg].

6. A mounting structure of an acceleration sensor, the mounting structure comprising the acceleration sensor that includes:
a semiconductor substrate that includes a support substrate and a semiconductor layer stacked on the support substrate;
a plurality of first-direction movable electrodes that are provided in the semiconductor layer and extended in one direction of a surface direction on the semiconductor substrate;

a plurality of second-direction movable electrodes that are provided in the semiconductor layer and extended in another direction orthogonal to the one direction and parallel to the surface direction;

at least one first-direction fixed electrode that is provided in the semiconductor layer and placed to face the first-direction movable electrodes, and sandwiched between the plurality of first-direction movable electrodes;

at least one second-direction fixed electrode that is provided in the semiconductor layer and placed to face the second-direction movable electrodes, and sandwiched between the plurality of second-direction movable electrodes; and a support member that is provided in the semiconductor layer, is provided with the first-direction movable electrodes and the second-direction movable electrodes, and integrally displaces the first-direction movable electrodes and the second-direction movable electrodes in accordance with acceleration, the acceleration sensor being mounted on one surface of a mount member so as to detect acceleration in a first direction in a surface direction of the one surface of the mount member and acceleration in a second direction orthogonal to the first direction and parallel to the surface direction of the one surface of the mount member, wherein, when each length of a section where the first-direction movable electrodes face the first-direction fixed electrode and where the second-direction movable electrodes face the second-direction fixed electrode is L, each interval between the first-direction fixed electrode and one of pair of first-direction movable electrodes that sandwich the first-direction fixed electrode and between the second-direction fixed electrode and one of pair of the second-direction movable electrodes that sandwich the second-direction fixed electrode is d1, and each interval between the first-direction fixed electrode and another of the pair of first-direction movable electrodes that sandwich the first-direction fixed electrode and between the second-direction fixed electrode and another of the pair of second-direction movable electrodes that sandwich the second-direction fixed electrode is a·d1, the acceleration sensor is mounted on the one surface of the mount member such that an angle formed by an extended direction of the first-direction movable electrodes and the first-direction fixed electrode and the second direction is $\sin^{-1}\{a \cdot d1/L(a-1)\}[\deg]$, and at a time when the acceleration in the second direction is applied and the first-direction movable electrodes are displaced, an increase/decrease in the length of the section where the first-direction movable electrodes face the first-direction fixed electrode matches an increase/decrease in the interval between the first-direction movable electrodes and the first-direction fixed electrode, and an angle formed by an extended direction of the second-direction movable electrodes and the second-direction fixed electrode and the first direction is $\sin^{-1}(a \cdot d1/L(a-1))[\deg]$, and at a time when the acceleration in the first direction is applied and the second-direction movable electrodes are displaced, an increase/decrease in the length of the section where the second-direction movable electrodes face the second-direction fixed electrode matches an increase/decrease in the interval between the second-direction movable electrode and the second-direction fixed electrode.

7. The mounting structure of the acceleration sensor according to claim 6, wherein:

when the one direction in the surface direction of the semiconductor substrate is defined as a first direction, and a direction orthogonal to the first direction and parallel to the surface direction of the semiconductor substrate is defined as a second direction, the angle formed by the extended direction of the first-direction movable electrodes and the first-direction fixed electrode and the second direction of the semiconductor substrate is $\sin^{-1}\{a \cdot d1/L(a-1)\}[\deg]$, and the angle formed by the extended direction of the second-direction movable electrodes and the second-direction fixed electrode and the first direction of the semiconductor substrate is $\sin^{-1}\{a \cdot d1/L(a-1)\}[\deg]$; and the acceleration sensor is mounted on the one surface of the mount member such that the first direction and the second direction of the semiconductor substrate are respectively parallel to the first direction and the second direction of the mount member.

8. The mounting structure of the acceleration sensor according to claim 6, wherein:

when the one direction in a surface direction of the semiconductor substrate is defined as a first direction, and a direction orthogonal to the first direction and parallel to the surface direction of the semiconductor substrate is defined as a second direction, the extended direction of the first-direction movable electrodes and the first-direction fixed electrode and the second direction of the semiconductor substrate are parallel to each other, and the extended direction of the second-direction movable electrodes and the second-direction fixed electrode and the first direction of the semiconductor substrate are parallel to each other; and the acceleration sensor is mounted on the one surface of the mount member such that the angle formed by each of the first direction and the second direction of the semiconductor substrate and the corresponding first direction and the second direction of the mount member is $\sin^{-1}\{a \cdot d1/L(a-1)\}[\deg]$.

* * * * *